US008792233B2

(12) United States Patent
Terlizzi

(10) Patent No.: US 8,792,233 B2
(45) Date of Patent: Jul. 29, 2014

(54) AESTHETICALLY PLEASING UNIVERSAL DOCK

(75) Inventor: Jeffrey J. Terlizzi, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 690 days.

(21) Appl. No.: 12/156,821

(22) Filed: Jun. 4, 2008

(65) Prior Publication Data

US 2009/0303692 A1 Dec. 10, 2009

(51) Int. Cl.
*H05K 7/14* (2006.01)
*G06F 1/16* (2006.01)

(52) U.S. Cl.
CPC .................................... *G06F 1/1632* (2013.01)
USPC .................. 361/679.41; 361/679.01; 439/529

(58) Field of Classification Search
CPC ....... G06F 1/1632; G06F 13/409; G06F 1/16; G06F 1/1613; G06F 1/1616; G06F 3/016; H05K 1/113; H05K 5/0017; H05K 5/0217; H05K 7/14
USPC ............... 361/679.4, 679.41, 679.02, 679.55, 361/679.34–36, 679.38, 679.43–679.44, 361/810; 710/303–305; 439/529, 929
See application file for complete search history.

(56) References Cited

U.S. PATENT DOCUMENTS

| 6,115,247 | A  * | 9/2000 | Helot ........................ 361/679.44 |
| 6,752,632 | B1 * | 6/2004 | Anderson et al. ............... 439/34 |
| 7,386,868 | B2 * | 6/2008 | McCormack .................. 720/657 |
| 7,643,283 | B2 * | 1/2010 | Jubelirer et al. ......... 361/679.41 |
| 7,719,830 | B2 * | 5/2010 | Howarth et al. ......... 361/679.41 |
| 7,840,740 | B2 * | 11/2010 | Minoo .......................... 710/303 |
| 2001/0026437 | A1 * | 10/2001 | Naruo et al. ................... 361/685 |
| 2007/0069088 | A1 * | 3/2007 | Bidiville et al. ........... 248/188.9 |
| 2007/0127205 | A1 * | 6/2007 | Kuo .............................. 361/686 |
| 2008/0239658 | A1 * | 10/2008 | Chou et al. .................... 361/686 |

* cited by examiner

*Primary Examiner* — Anthony Haughton
*Assistant Examiner* — Ingrid Wright
(74) *Attorney, Agent, or Firm* — Kilpatrick Townsend & Stockton LLP

(57) ABSTRACT

An aesthetically pleasing universal dock may support a variety of electronic devices of different shapes and designs while appearing to be customized to individually support each electronic device. The universal dock may support an electronic device using a support layer that may include any suitable material, including, for example, an array of vertical members, an elastic sponge-like substance, or any other suitable material. The compression of the support layer may be retained for future use with the electronic device, or the compression may be relieved, once the electronic device is removed from the universal dock.

25 Claims, 15 Drawing Sheets

AESTHETICALLY PLEASING UNIVERSAL DOCK

FIELD OF THE INVENTION

This invention can relate to apparatus and methods with improved aesthetics for supporting electronic devices.

BACKGROUND OF THE DISCLOSURE

Currently, there are a wide variety of known electronic device docks that include a connection component (e.g., a 30-pin connector) for electrically connecting to an electronic device. The connection between the dock and the electronic device may be established to provide power, to transfer data or other information, or for any other suitable reason. The shape of many of these docks is customized by using a collection of removable inserts that are inserted individually into the dock to give the appearance that the dock was designed to support an electronic device of a particular shape. If one insert is removed, another insert may be placed into the dock to alter the customized appearance of the dock and to support an electronic device of a different shape. However, these inserts may complicate the use of the dock, for example, if an insert that may be necessary to support a particular electronic device in the dock is unavailable to a user of the electronic device (e.g., if the user loses a particular insert). An insert may also complicate the use of the dock because, without the insert, the dock may not appear to be customized to support the electronic device properly or may not support the device at all.

Therefore, it would be beneficial to provide a universal dock capable of properly supporting numerous types of electronic devices while eliminating the need for manual user intervention to customize the dock. In addition, a universal dock capable of properly supporting a variety of electronic devices while appearing aesthetically to a user to be custom designed to support each connected electronic device would also be beneficial.

SUMMARY OF THE DISCLOSURE

Improved aesthetics for a universal dock to support a wide variety of electronic devices are provided. In one embodiment, a dock that supports a plurality of differently-shaped electronic devices includes a housing, a connector coupled to the housing, and a compressible support layer positioned at least partially about the connector. At least a portion of the compressible support layer compresses to the shape of at least a portion of an electronic device that is attached to the connector.

In one embodiment, a method for supporting a plurality of differently-shaped electronic devices in a dock includes positioning a compressible support layer at least partially about a connector, attaching the electronic device to the connector of the dock, compressing at least a first portion of the compressible support layer with at least a portion of the bottom of the electronic device when the electronic device is attached to the connector, and supporting at least a portion of a side of the electronic device with at least a second portion of the compressible support layer when the electronic device is attached to the connector.

In one embodiment, a method for supporting a plurality of differently-shaped electronic devices in a dock includes positioning a support layer at least partially about a connector, detecting an electronic device; determining the make of the electronic device in response to detecting the electronic device, adjusting at least a first portion of the support layer to support at least a portion of the bottom of the electronic device in response to determining the make of the electronic device, attaching the electronic device to the connector, and adjusting at least a second portion of the support layer to support at least a portion of a side of the electronic device when the electronic device is attached to the connector.

In one embodiment, a dock that supports a plurality of differently-shaped electronic devices includes a housing, a connector coupled to the housing, and a compressible support layer positioned at least partially about the connector. The compressible support layer is configured to appear customized to the shape of any electronic device of the differently-shaped electronic devices attached to the connector, and wherein the compressible support layer supports the electronic device.

BRIEF DESCRIPTION OF THE DRAWINGS

The above and other aspects and advantages of the invention will become more apparent upon consideration of the following detailed description, taken in conjunction with the accompanying drawings, in which like reference characters refer to like parts throughout, and in which.

DETAILED DESCRIPTION OF THE DISCLOSURE

Figure 1:
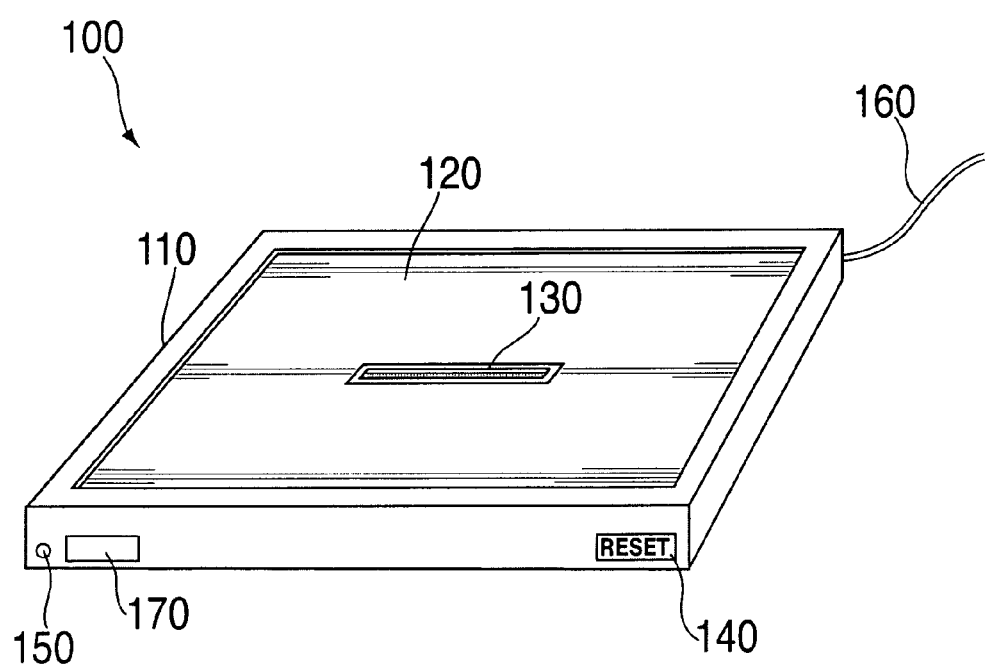
FIG. 1 shows a perspective view of a universal dock in accordance with some embodiments of the invention.

In some embodiments of the invention, an electronic device may be supported when connected to a universal dock. The support may be provided using a support layer. The support layer may be made of any suitable material or configuration of elements, such as a fabric with elasticity (e.g., nylon), an elastic sponge-like material that may retain its shape when a force is applied thereto, an array of spring-loaded vertical members that may compress in response to a downward force (e.g., weight created by an electronic device being connected to the universal dock), or any combinations thereof.

In one embodiment, the support layer may be comprised of an array of compressible vertical members that may not require manipulation by a user of the universal dock in order to support a device of a particular shape. The top portion of each vertical member may touch at least one other top portion of one other vertical member, or the top portions of all of the vertical members may be interconnected with a webbing, such that the top portions of the vertical members form a substantially seamless web. The vertical members may be spring-loaded or flexure loaded to provide an upward bias to counteract a downward force (e.g., the weight of an electronic device) and to support the electronic device. If an electronic device is connected to a universal dock, the vertical members that contact the underside of the electronic device may be at least partially compressed by the downward force exerted thereon by the electronic device (e.g., by the weight of the electronic device). The shape of the electronic device being connected to the universal dock may result in some vertical members experiencing maximum compression, while other vertical members may be partially compressed or not compressed at all while the electronic device is connected. The vertical members that may not be in contact with the electronic device may not be compressed and may appear to align or seamlessly mesh with the sides of the electronic device. The non-compressed vertical members contacting the sides of the electronic device may provide lateral support to the electronic device to prevent the electronic device from tilting or shifting while connected to the universal dock. In addition, these non-compressed vertical members may provide lateral support to the sides of the device to lessen any strain that may be applied to the connector of the universal dock by the electronic device when connected to the connector.

If the electronic device is disconnected from the universal dock, the vertical members that may have been compressed may remain compressed despite the removal of the downward force on the vertical members. This lasting compression may aid a user in using the universal dock again with the same electronic device by eliminating the need to compress the support layer to conform to the shape of the electronic device while connecting the electronic device to the dock. In addition, this lasting compression may provide an aesthetic benefit because the universal dock may appear to the user to be customized to support the user's electronic device.

In some embodiments of the invention, a "RESET" button may exist on any suitable portion of the universal dock. The "RESET" button may return the support layer to its original, uncompressed state (e.g., the shape it may have occupied prior to the initial connection of an electronic device to the universal dock). To return any compressed vertical members to their original, uncompressed state, the "RESET" button may be depressed on the universal dock, and the vertical members may extend upwards due to an upward force that may be applied to the bottoms thereof. For example, the upward force may be applied by one or more springs that may be loaded at the base of each vertical member or one spring that may be loaded at the base of the support layer as a whole. Alternatively, the support layer may reform naturally to its original, uncompressed state when the weight is removed.

In some embodiments of the invention, the support layer may be comprised of an elastic, sponge-like material. If an electronic device is connected to a universal dock, the sponge-like material may be compressed by the downward force (e.g., the weight of the electronic device). That portion of the support layer that may not be compressed under the weight of the electronic device may align with the sides of the electronic device and may provide lateral support to the electronic device while it is connected to the universal dock. If the electronic device is disconnected from the universal dock, the portion of the sponge-like material that may have been compressed may remain compressed despite the removal of the downward force. This lasting compression may aid a user in using the universal dock again with the same electronic device by eliminating the need to compress again that same portion of the support layer to conform to the shape of the electronic device. In addition, the lasting compression may provide an aesthetic benefit because the universal dock may appear to the user to be customized to support the user's electronic device. To return the sponge-like material to its original, uncompressed state, a "RESET" button located on the universal dock may be depressed, and the sponge-like material may be reformed by the application of any suitable upward force from the universal dock. Alternatively, the support layer may reform naturally to its original, uncompressed state when the weight is removed.

In some embodiments of the invention, the support layer may be comprised of any suitable material, but instead of possessing a maximum thickness when no electronic device is connected to a universal dock, the support layer may possess a minimum thickness in its original state (e.g., when no electronic device is connected to a universal dock). If an electronic device is connected to the universal dock, then the support layer may rise and expand around a portion of the bottom of the electronic device to provide support as the electronic device is being connected. The support layer also may expand around a portion of the sides of the electronic device to provide lateral support while the electronic device is connected to the universal dock.

If the electronic device is disconnected from the universal dock, the portion of the support layer that may have risen and expanded to support the electronic device may remain in that state despite the removal of the electronic device. This retained position of the support layer may aid a user in using the universal dock again with the same electronic device by eliminating the need to adjust again that same portion of the support layer to conform to the shape of the electronic device. In addition, the retained position may provide an aesthetic benefit because the universal dock may appear to the user to be customized to support the user's electronic device. To return the support layer to its original, minimal thickness, a "RESET" button located on the universal dock may be depressed, and the support layer may be reduced by the application of any suitable force or signal from the universal dock. Alternatively, the support layer may lower naturally to its original state when the electronic device is removed.

In some embodiments of the invention, the universal dock may contain additional circuitry to operate an electronic device while it is connected to the universal dock. For example, the universal dock may include an infrared sensor that may detect commands from a remote control. The universal dock may also include logic circuitry that may process commands received from the remote control via the infrared sensor and that may operate the electronic device connected to the universal dock in response to the received commands.

In some embodiments of the invention, the universal dock may contain additional circuitry capable of adjusting the support layer to support a particular electronic device. For example, a face of the universal dock may include one or more buttons, each of which may be associated with a particular electronic device type. If the circuitry detects that one of the buttons is depressed, then the circuitry may signal the support layer to conform to the shape of the electronic device associated with the depressed button.

In some embodiments of the invention, the universal dock may contain additional circuitry (e.g., logic circuitry) capable of detecting the type of electronic device that is connected to the universal dock. If the circuitry has detected and determined the particular type of electronic device that is connected to the universal dock, then the circuitry may control the support layer and may signal the support layer to conform to the shape of the electronic device to provide maximum support as it is being connected to the universal dock. For example, the circuitry may signal the support layer to rise and expand around a portion of the bottom and the sides of the electronic device to provide support as the electronic device is being connected to the universal dock. As another example, the circuitry may signal the support layer to compress beneath a portion of the bottom and the sides of the electronic device.

Improved aesthetics for a universal dock to support a wide variety of electronic devices are provided and described with reference to FIGS. 1-16.

FIG. 1 shows a perspective view of a universal dock in accordance with some embodiments of the invention. Universal dock 100 may include housing 110, support layer 120, connector 130, "RESET" button 140, sensor 150, and any other suitable feature.

Housing 110 may at least partially be made of any suitable material for providing structural support to universal dock 100. For example, housing 110 may be made of plastic, metal, any combination thereof, or any other suitable material. Housing 110 may also include any suitable openings for connecting cables, power sources, or other devices to universal dock 100, such as openings for connector 130, cable 160, or any other suitable opening. Housing 110 may also include any suitable circuitry 170 to process input signals received from an electronic device connected to universal dock 100, to process commands directed at the electronic device, to operate the electronic device, and/or to provide power to the electronic device. Housing 110 may include dimensions of any suitable depth, width, and height to support a range of electronic devices of various sizes.

Support layer 120 may at least partially be made of any suitable material operative to provide support for, while also providing the aesthetic benefit of appearing to be customized to the shape of, an electronic device that may be connected to universal dock 100. For example, support layer 120 may be made of any suitable material, including, but not limited to a fabric with elasticity (e.g., nylon), an elastic sponge-like material that may retain its shape when a force is applied thereto, an array of spring-loaded vertical members whose top portions may be interconnected (e.g., by means of a Teflon sheet or by means of a webbing), or any other suitable material that may be compressed in response to a force applied thereto (e.g., the weight of an electronic device resting on support layer 120 while the electronic device may be connected to connector 130 of universal dock 100). Support layer 120 may be of any suitable thickness and of any suitable flexibility. Support layer 120 may also occupy any suitable amount of surface area on the top face of universal dock 100 to provide support for a range of electronic devices of various dimensions.

Connector 130 may include any suitable means for establishing and maintaining an electrical connection between universal dock 100 and an electronic device. For example, connector 130 may include a male 30-pin connector element that may be visible from the top face of universal dock 100. Connector 130 also may at least partially be positioned upon any suitable material for guiding an electronic device to make a connection with universal dock 100 and for supporting connector 130. For example, connector 130 may be positioned upon a base of plastic or metal (not shown). The base of connector 130 may be mounted to housing 110 and may pass through support layer 120 to permit connector 130 to emerge on the top face of universal dock 100. The base of connector 130 may also protect connector 130 from compression or damage if support layer 120 is compressed around connector 130. In some embodiments, an electronic device with a female 30-pin connector positioned on its bottom face may be connected to universal dock 100 when connector 130 contacts the female 30-pin connector of the electronic device.

"RESET" button 140 may include any suitable elements for returning support layer 120 to its original, uncompressed state after support layer 120 has been compressed by an electronic device. For example, "RESET" button 140 may include a plastic button positioned on any face of universal dock 100 (e.g., the front face, as shown in FIG. 1) and may include any suitable legend to indicate its purpose (e.g., a "RESET" legend or an "EJECT" legend). "RESET" button 140 may operate with any suitable mechanism to return support layer 120 to its original, uncompressed state. For example, "RESET" button 140 may operate to generate an upward force (e.g., a mechanical spring force or an electrical signal) to move upwards that portion of support layer 120 that may have been compressed by an electronic device.

Sensor 150 may include any suitable elements for detecting an electrical signal from an external source and for transmitting the electrical signal to universal dock 100. In one embodiment, sensor 150 may be an infrared sensor capable of detecting an electrical signal from an external remote control. For example, a remote control may generate a command to control an electronic device and may transmit that command in the form of an electrical signal to sensor 150 in order to operate an electronic device that may be connected to universal dock 100. If sensor 150 detects an electrical signal generated by a remote control, sensor 150 may transmit that signal to universal dock 100. Universal dock 100 may include any suitable circuitry (e.g., circuitry 170) for processing the electrical signal from the remote control. Universal dock 100 may also include any suitable circuitry (e.g., circuitry 170) for operating the electronic device connected to universal dock 100 in response to the electrical signal transmitted by the remote control. Universal dock 100 may process the electrical signal detected by sensor 150 and may generate a second electrical signal to operate the electronic device in response to the first signal from the remote control.

Cable 160 may include any suitable elements for transmitting power or data to universal dock 100 and/or transmitting data from universal dock 100. For example, cable 160 may include an Ethernet cable, a power cable, a USB cable, a FireWire cable, or any other suitable elements.

Figure 2A:
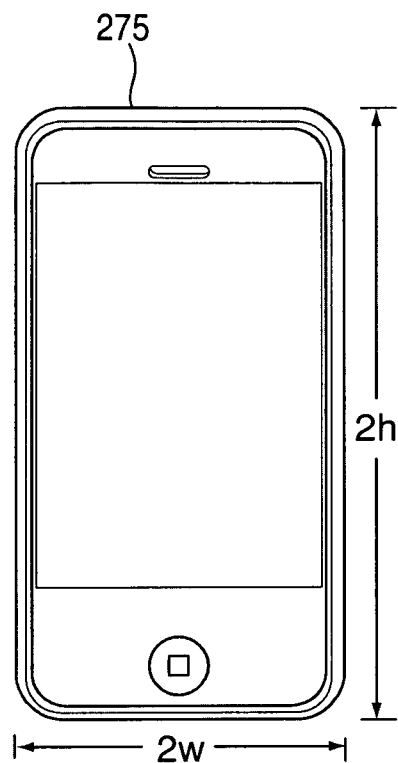
FIGS. 2A and 2B show a front view and a bottom view of a first electronic device capable of being supported by the universal dock of FIG. 1 in accordance with some embodiments of the invention.
Figure 2B:
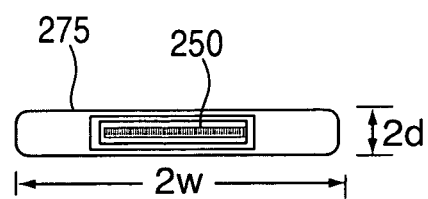

FIGS. 2A and 2B show a front view and a bottom view of a first electronic device 275 capable of being supported by universal dock 100 (FIG. 1) in accordance with some embodiments of the invention. Electronic device 275 may include any suitable device capable of connecting to universal dock 100. For example, electronic device 275 may include a media player, such as an iPod™ classic or an iPod™ touch available by Apple Inc. of Cupertino, Calif., a cellular telephone, such as an iPhone™ available by Apple Inc., a device capable of communicating wirelessly (with or without the aid of a wireless enabling accessory system) or via wired pathways (e.g., using traditional electrical wires), a pocket-sized personal computer such as an iPAQ Pocket PC available by Hewlett Packard Inc. of Palo Alto, Calif., a personal digital assistant ("PDA"), or a personal e-mail or messaging device with audio and/or video capabilities (e.g., a Blackberry® or a Sidekick®).

FIG. 2A shows a front view of electronic device 275. Electronic device 275 may be of any suitable width $2w$ and any suitable height $2h$, may possess edges of any suitable shape, and may be of any suitable weight, all capable of being supported by universal dock 100.

FIG. 2B shows a bottom view of electronic device 275. Electronic device 275 may also be of any suitable depth $2d$ capable of being supported by universal dock 100. Electronic device 275 may be connected to universal dock 100 using a connector 250. Connector 250 may include any suitable means for establishing and maintaining an electrical connection between universal dock 100 and electronic device 275. For example, connector 250 may include a female 30-pin connector element that may be visible from the bottom face of electronic device 250.

Figure 3:
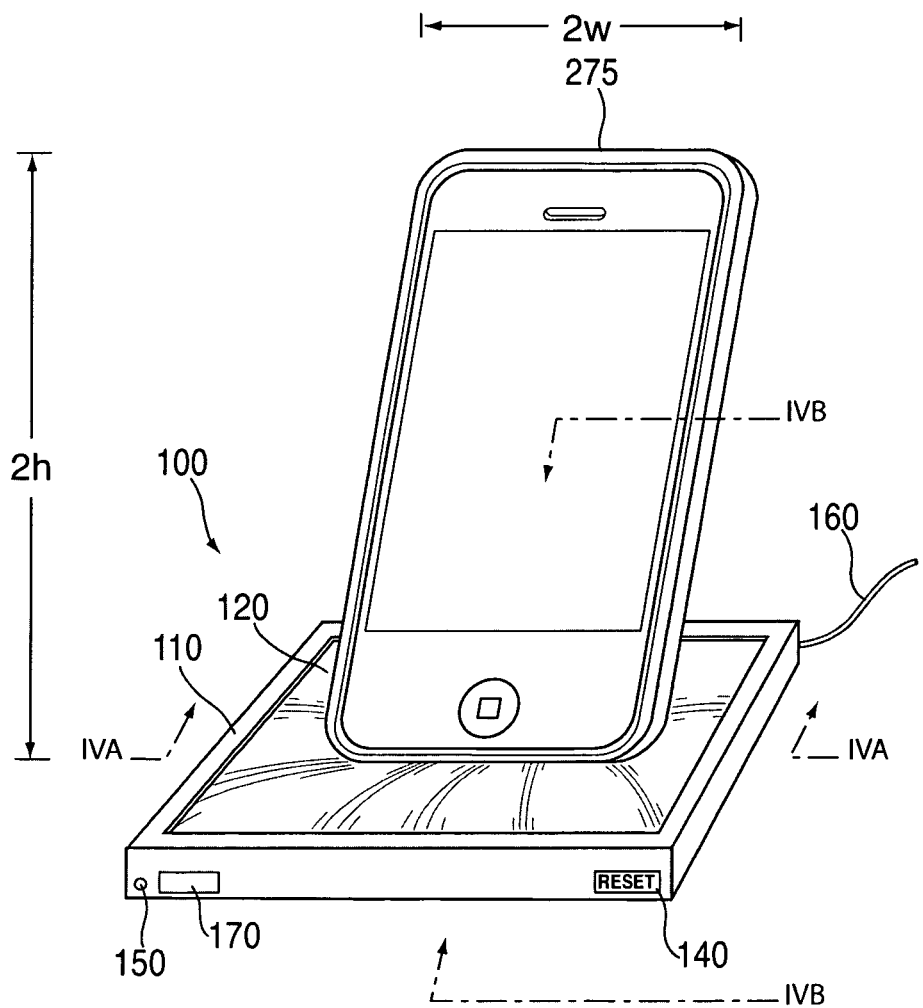
FIG. 3 shows a perspective view of the universal dock of FIG. 1 connected to the first electronic device of FIGS. 2A and 2B in accordance with some embodiments of the invention.

FIG. 3 shows a perspective view of universal dock 100 (FIG. 1) connected to first electronic device 275 (FIGS. 2A and 2B) in accordance with some embodiments of the invention. Universal dock 100 may include housing 110, support layer 120 capable of supporting electronic device 275 with dimensions $2h$, $2d$, and $2w$ (FIGS. 2A and 2B), "RESET" button 140, sensor 150, cable 160, and circuitry 170 as described in FIG. 1. Universal dock 100 may also include any other suitable feature, such as connector 130 (not shown) to permit connection between electronic device 275 and universal dock 100.

Electronic device 275 may be connected to universal dock 100 using any suitable approach. For example, electronic device 275 may be connected when connector 250 (FIG. 2B) is coupled to connector 130 (FIG. 1). If electronic device 275 is connected to universal dock 100, electronic device 275 may contact support layer 120. In some embodiments of the invention, support layer 120 may be at least partially made of an elastic, sponge-like material. In establishing an electrical connection between connector 250 and connector 130, the weight of electronic device 275 may compress a portion of support layer 120 located underneath electronic device 275. The compression of support layer 120 to mimic the dimensions $2w$ and $2d$ of electronic device 275 as it may be connected to universal dock 100 may provide customized support to electronic device 275 based upon the unique shape of electronic device 275. The compression of support layer 120 may also give a user the aesthetic impression that universal dock 100 has been custom designed to support the shape of electronic device 275.

In some embodiments, a remote control may be employed to operate electronic device 275 while electronic device 275 is connected to universal dock 100. Sensor 150 may detect electrical signals generated by a remote control and may transmit those signals to universal dock 100. Universal dock 100 may include logic circuitry (e.g., circuitry 170) that may process the electrical signals received from sensor 150 and may operate electronic device 275 in response to the electrical signals generated by the remote control.

In some embodiments, electronic device 275 may be ejected from universal dock 100. A user of electronic device 275 may pull upward on electronic device 275 to end the connection between connector 250 and connector 130, or the "RESET" button 140 on the front face of universal dock 100 may be depressed to end the connection and effectively eject electronic device 275 from universal dock 100. "RESET" button 140 may include any suitable mechanism for ending the connection between connector 130 and connector 250. For example, "RESET" button 140 may be joined with a mechanical mechanism within universal dock 100 that may provide an upward force to eject electronic device 275 from universal dock 100 if "RESET" button 340 is depressed. In some embodiments, electronic device 275 may be ejected from universal dock 100 while support layer 120 may remain compressed in a shape resembling dimensions $2w$ and $2d$ of electronic device 275, as described in more detail with respect to FIG. 5 below. This lasting compression may be desirable if a user connects electronic device 275 to universal dock 100 repeatedly, or if electronic device 275 is the only electronic device that a user may connect to universal dock 100. In other embodiments, if "RESET" button 140 is depressed, electronic device 275 may be ejected from universal dock 100 and support layer 120 may return to its original, uncompressed state in which it may have existed before electronic device 275 compressed it.

Figure 4A:
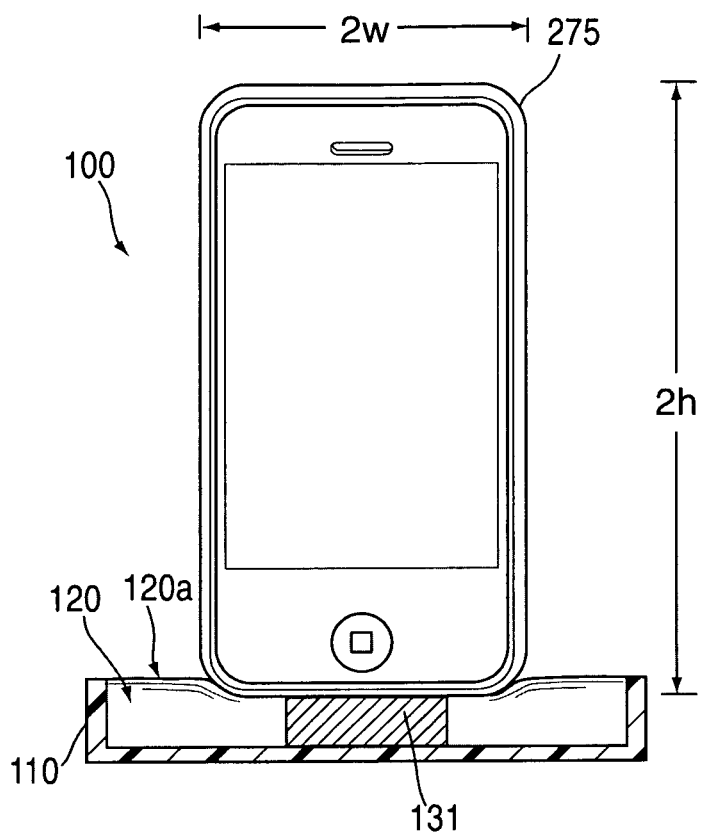
FIG. 4A shows a cross-sectional view of a portion of the universal dock and first electronic device of FIG. 3, taken from line IVA-IVA of FIG. 3 in accordance with some embodiments of the invention.
Figure 4B:
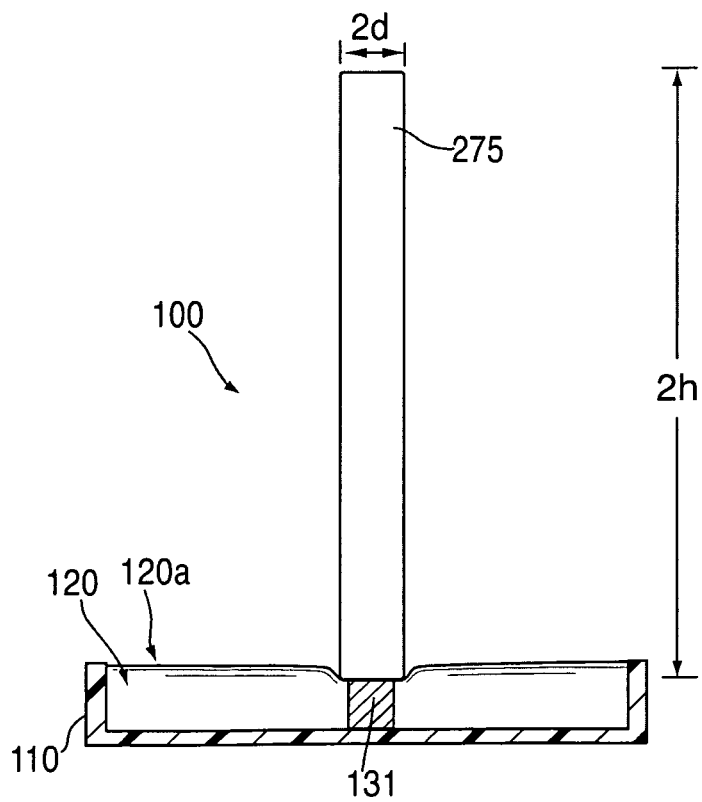
FIG. 4B shows a cross-sectional view of a portion of the universal dock and first electronic device of FIG. 3, taken from line IVB-IVB of FIG. 3 in accordance with some embodiments of the invention.

FIGS. 4A and 4B show cross-sectional views of a portion of universal dock 100 and first electronic device 275 of FIG. 3, taken from lines IVA-IVA and IVB-IVB, respectively, of FIG. 3, in accordance with some embodiments of the invention. Electronic device 275 may be connected to universal dock 100 by means of connector 130 and connector 250 (not shown). Connector 130 may be attached to a base 131 that may be positioned on housing 110 and may pass through support layer 120. Base 131 may include any suitable material, such as a plastic or metal shaft, below connector 130 to provide support for connector 130 as it may be exposed on the top face of universal dock 100. If a user attempts to connect electronic device 275 to universal dock 100, electronic device 275 may contact both connector 130 and support layer 120. Base 131 and housing 110 may not compress under the weight of electronic device 275 so that connector 130 may form an electrical connection and a physical connection with connector 250 without moving further downwards due to the weight of electronic device 275. Support layer 120 may absorb the downward force (e.g., the weight) present because of the connection between connector 250 and connector 130 within universal dock 100. Support layer 120 may compress and support layer surface 120a may deform in response to the downward force. Support layer surface 120a may be of any suitable thickness (e.g., the outermost layer of molecules of an elastic, sponge-like support layer, or the webbing that may join together vertical members within a support layer comprised of an array of vertical members) to experience the maximum deformation in response to a downward force (e.g., weight) being exerted on support layer surface 120a. The deformation of support layer surface 120a may correspond to dimensions 2d and 2w (FIGS. 2A and 2B) of electronic device 275 to maximize the support of electronic device 275. The corresponding deformation of support layer surface 120a also may give a user of universal dock 100 an aesthetic impression that universal dock 100 was custom designed to support the shape of electronic device 275.

Figure 5A:
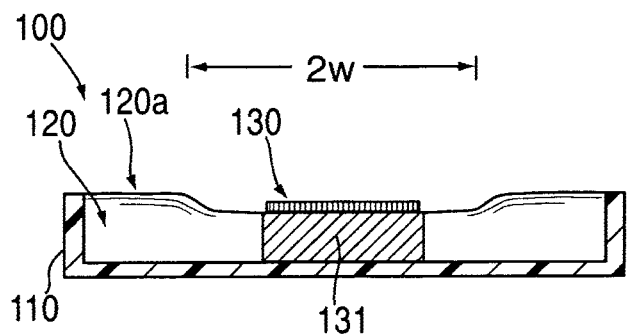
FIGS. 5A and 5B show the cross-sectional views of the portion of the universal dock of FIGS. 4A and 4B, respectively, but without the first electronic device, in accordance with some embodiments of the invention.
Figure 5B:
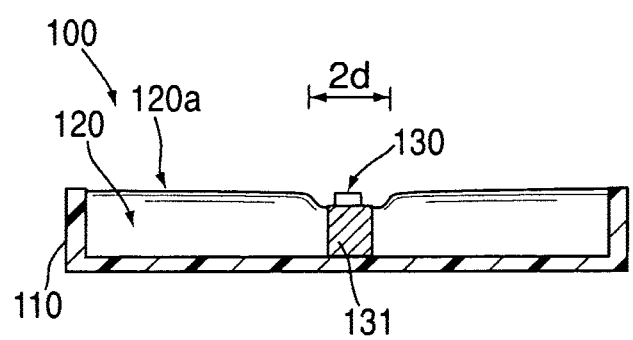

FIGS. 5A and 5B show cross-sectional views of the portion of the universal dock of FIGS. 4A and 4B, respectively, but without first electronic device 275, in accordance with some embodiments of the invention. Electronic device 275 may have been separated from connector 130 using any suitable method (e.g., a user may have pulled upwards on electronic device 275 to physically disconnect connector 250 (FIG. 2) from connector 130, or "RESET" button 140 (not shown) may have been depressed to eject electronic device 275 from universal dock 100). In some embodiments, support layer 120 may remain compressed although electronic device 275 may have been removed from universal dock 100. Support layer surface 120a may remain deformed in a shape that may correspond with the dimensions 2w and 2d of electronic device 275 that had previously been supported by universal dock 100. This lasting compression may be desirable because a user may use universal dock 100 again with electronic device 275 while eliminating the need to compress support layer 120 to conform to the shape of electronic device 275. Despite the compression of support layer 120 and the deformation of support layer surface 120a, base 131 and housing 110 may not compress so as to allow electronic device 275 to connect with connector 130 at a fixed point.

Figure 6A:
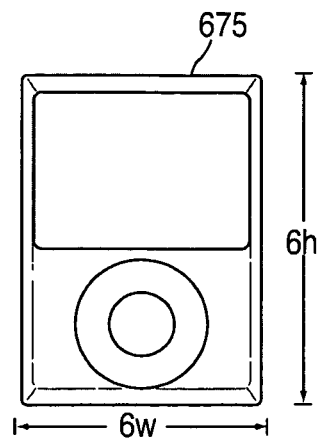
FIGS. 6A and 6B show a front view and a bottom view of a second electronic device capable of being supported by the universal dock of FIG. 1 in accordance with some embodiments of the invention.
Figure 6B:
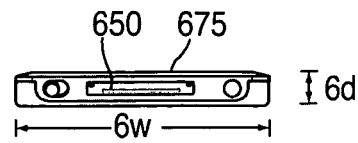

FIGS. 6A and 6B show a front view and a bottom view of a second electronic device 675 capable of being supported by universal dock 100 (FIG. 1) in accordance with some embodiments of the invention. Electronic device 675 may include any suitable device capable of connecting to universal dock 100. For example, electronic device 675 may include an iPod Nano™ available by Apple Inc. of Cupertino, Calif.

FIG. 6A shows a front view of electronic device 675. Electronic device 675 may be of any suitable width 6w and any suitable height 6h, may possess edges of any suitable shape, and may be of any suitable weight, all capable of being supported by universal dock 100. Each dimension 6w and 6h may be different from width 2w and height 2h, respectively, of electronic device 275 (FIG. 2). The weight of electronic device 675 may also be different from the weight of electronic device 275.

FIG. 6B shows a bottom view of electronic device 675. Electronic device 675 may also be of any suitable depth 6d capable of being supported by universal dock 100. Depth 6d may be different from depth 2D of electronic device 275 (FIG. 2A). Electronic device 275 may be connected to universal dock 100 using connector 650 which may be visible from the bottom face of electronic device 650. Connector 650 may be the same as, and may include some or all of the features of, connector 250 (FIG. 2B). For example, connector 650 may include a female 30-pin connector element.

First electronic device 275 and second electronic device 675 are illustrative examples of two different electronic devices with markedly different dimensions that may each connect to universal dock 100. Any suitable electronic device having dimensions that may be compatible with support layer 120 and connector 130 may connect thereto, regardless of whether the dimensions of the electronic device are similar to the dimensions of electronic device 275 or electronic device 675.

Figure 7:
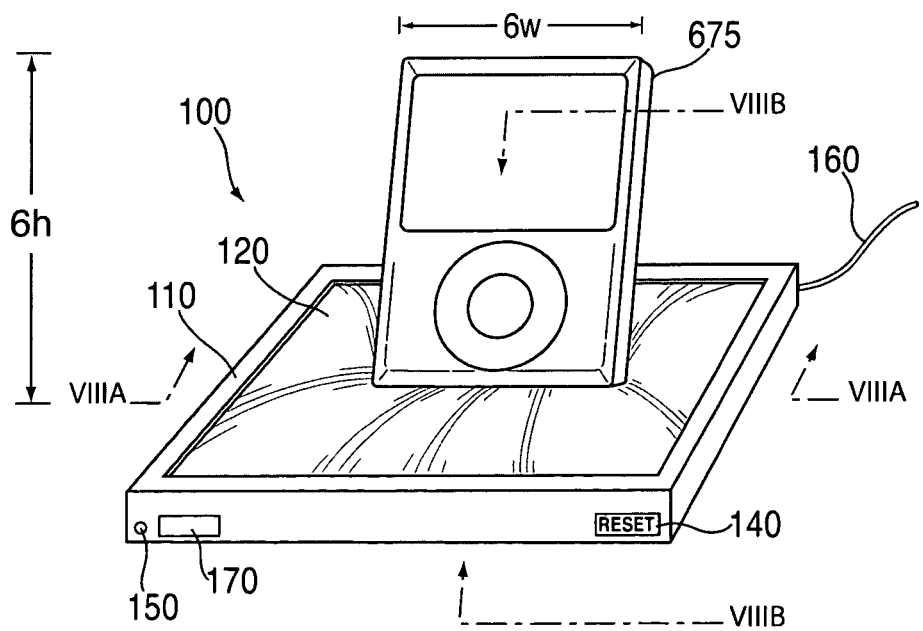
FIG. 7 shows a perspective view of the universal dock of FIG. 1 connected to the second electronic device of FIGS. 6A and 6B in accordance with some embodiments of the invention.

FIG. 7 shows a perspective view of universal dock 100 connected to second electronic device 675 (FIGS. 6A and 6B) in accordance with some embodiments of the invention. Universal dock 100 may include housing 110, support layer 120 capable of supporting electronic device 675 with dimensions 6h, 6d, and 6w (FIGS. 6A and 6B), "RESET" button 140, sensor 150, cable 160, and circuitry 170 all as described in FIG. 1. Universal dock 100 may also include any other suitable feature, such as connector 130 (not shown) to permit connection between connector 650 (FIG. 6B) and universal dock 100. Electronic device 675 may include any suitable device capable of connecting to universal dock 100 and capable of transmitting and receiving inputs, such as an iPod Nano™ available by Apple Inc.

Electronic device 675 may be connected to universal dock 100 using any suitable approach. For example, electronic device 675 may be connected when connector 650 (FIG. 6B) is coupled to connector 130. If electronic device 675 is connected to universal dock 100, electronic device 675 may contact support layer surface 120a and may compress support layer 120. In establishing an electrical connection between connector 650 and connector 130, the weight of electronic device 675 may compress a portion of support layer 120 located underneath electronic device 675. The compression of support layer 120 may support electronic device 675 by conforming to dimensions 6w and 6d of electronic device 675. The compression of support layer 120 may also give a user the aesthetic impression that universal dock 100 may have been designed to provide customized support to the shape of electronic device 675.

In some embodiments, the compression of support layer 120 and the deformation of support layer surface 120a when supporting second electronic device 675 (FIGS. 6A and 6B) may not be contoured in the same manner as the compression of support layer 120 and the deformation of support layer surface 120a when supporting first electronic device 275 (FIGS. 2A-4B) because electronic device 675 may possess different physical dimensions than electronic device 275. Universal dock 100 may, however, support first electronic device 275 and second electronic device 675 using the same support layer 120. In each instance, support layer 120 may deform around the unique dimensions of the connected electronic device to maximize support for that electronic device and support layer 120 may appear to a user to be customized to support the shape of that electronic device.

In some embodiments, electronic device 675 may end its connection with universal dock 100. A user of electronic device 675 may pull upward on electronic device 675 to terminate the connection between connector 650 and connector 130 in universal dock 100. Alternatively, the "RESET" button 140 on the front face of universal dock 100 may be depressed to separate electronic device 675 from connector 130 and effectively eject electronic device 675 from universal dock 100. In some embodiments, electronic device 675 may be ejected from universal dock 100 while support layer 120 may remain compressed in a shape resembling dimensions 6w and 6d of electronic device 675. This lasting compression may be desirable if a user connects electronic device 675 to universal dock 100 again because it may make a future connection of electronic device 675 more efficient by eliminating the need to compress support layer 120 again. It also may give a user an aesthetic impression that universal dock 100 may be customized to support the shape of electronic device 675. In other embodiments, if "RESET" button 140 is depressed, electronic device 675 may be ejected from universal dock 100 and support layer 120 may return to its original, uncompressed state in which it may have existed before electronic device 675 compressed it.

Figure 8A:
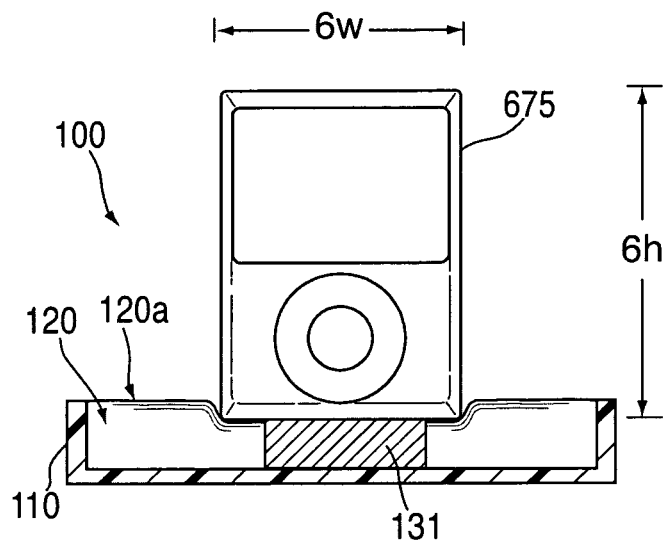
FIG. 8A shows a cross-sectional view of a portion of the universal dock and second electronic device of FIG. 7, taken from line VIIIA-VIIIA of FIG. 7, in accordance with some embodiments of the invention.
Figure 8B:
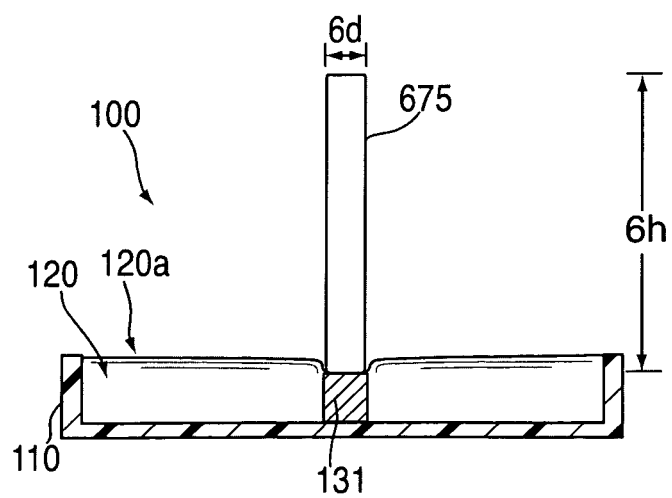
FIG. 8B shows a cross-sectional view of a portion of the universal dock and second electronic device of FIG. 7, taken from line VIIIB-VIIIB of FIG. 7, in accordance with some embodiments of the invention.

FIGS. 8A and 8B show cross-sectional views of a portion of universal dock 100 and second electronic device 675 of FIG. 7, taken from lines VIIIA-VIIIA and VIIIB-VIIIB, respectively, of FIG. 7, in accordance with some embodiments of the invention. Electronic device 675 may be connected to universal dock 100 by means of connector 130 and connector 650 (not shown). If a user attempts to connect electronic device 675 to universal dock 100, electronic device 675 may contact both connector 130 and support layer 120. Base 131 and housing 110 may not compress under the weight of electronic device 675 so that connector 130 may form an electrical connection and a physical connection with connector 650 without moving further downwards due to the weight of electronic device 675. Support layer 120 may absorb the downward force (e.g., the weight) present because of the connection between connector 650 and connector 130 within universal dock 100. Support layer 120 may compress and support layer surface 120a may deform in response to the downward force. The deformation of support layer surface 120a may correspond to dimensions 6w and 6d of electronic device 675 to maximize the support of electronic device 675. The corresponding deformation of support layer surface 120a also may give a user of universal dock 100 an aesthetic impression that universal dock 100 was custom designed to support the shape of electronic device 675. Further, the deformation of support layer surface 120a by electronic device 675 may not appear to a user to be the same deformation that may be caused by electronic device 275 making contact with support layer surface 120a (FIG. 4).

Figure 9A:
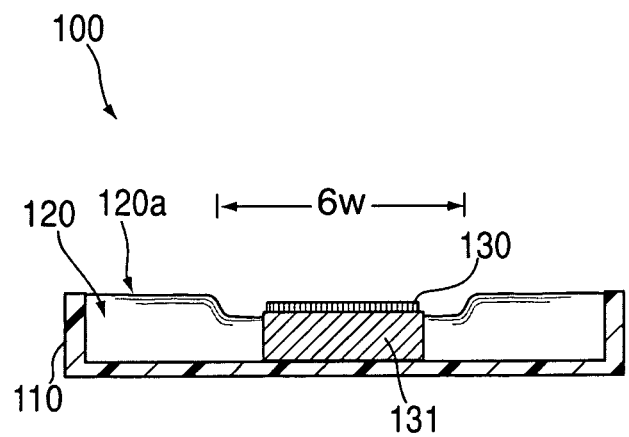
FIGS. 9A and 9B show cross-sectional views of the portion of the universal dock of FIGS. 8A and 8B, respectively, but without the second electronic device, in accordance with some embodiments of the invention.
Figure 9B:
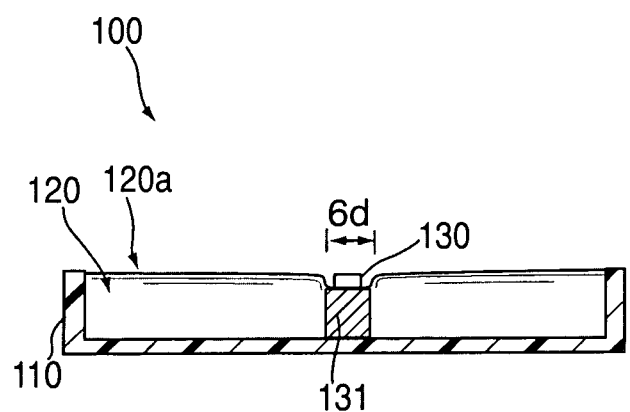

FIGS. 9A and 9B show the cross-sectional views of the portion of universal dock 100 of FIGS. 8A and 8B, respectively, but without second electronic device 675, in accordance with some embodiments of the invention. Electronic device 675 may have been separated from connector 130 using any suitable method (e.g., a user may have pulled upwards on electronic device 675 to physically disconnect connector 650 (FIG. 2) from connector 130, or "RESET" button 140 (not shown) may have been depressed to eject electronic device 675 from universal dock 100).

In some embodiments, support layer 120 may remain compressed although electronic device 675 may have been removed from universal dock 100. Support layer surface 120a may remain deformed in a shape that may correspond with the dimensions 6w and 6d of electronic device 675 that had previously been supported by universal dock 100. The deformation of support layer surface 120a following removal of electronic device 675 from universal dock 100 may not correspond to the deformation retained by support layer surface 120a following removal of electronic device 275 from universal dock 100 because of the different physical dimensions of the two electronic devices. The lasting compression of support layer surface 120a may be desirable because a user may use universal dock 100 again with electronic device 675 while eliminating the need to compress support layer 120 to conform to the shape of electronic device 675. Despite the compression of support layer 120 and the deformation of support layer surface 120a, base 131 and housing 110 may not compress so as to allow electronic device 675 to connect with connector 130 at a fixed point.

Figure 10:
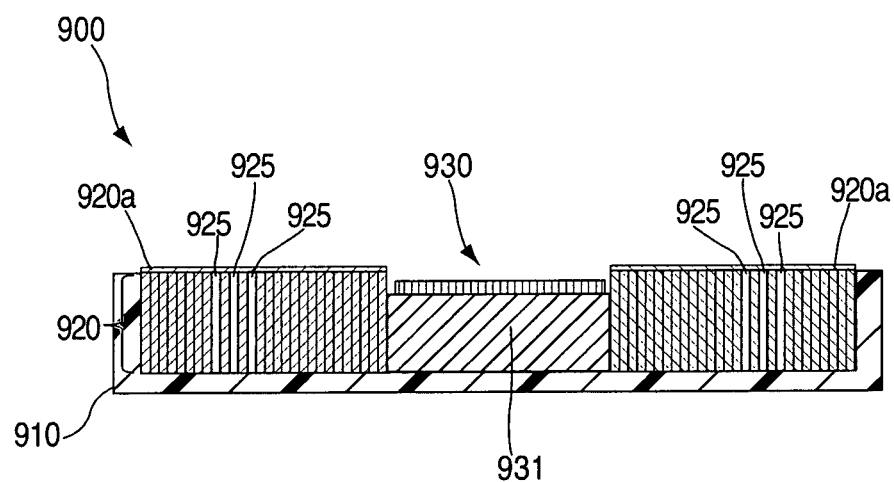
FIG. 10 shows a cross-sectional view of a portion of a universal dock in accordance with some embodiments of the invention.

FIG. 10 shows a cross-sectional view of a portion of a universal dock in accordance with some embodiments of the invention. Universal dock 900 may include housing 910, connector 930, and base 931, each of which may be the same as, and may include some or all of the features of, housing 110, connector 130, and base 131, respectively. Universal dock 900 may also include a cable (not shown) to allow universal dock 900 to receive power or information from or to transmit information to any suitable source, or any other suitable features.

Universal dock 900 also may include support layer 920 which may at least partially be made of any suitable material operative to provide support for an electronic device that may be connected to universal dock 900. For example, support layer 920 may include an array of vertical members 925. Each vertical member 925 may at least partially be made of any suitable material operative to compress in response to the application of a downward force. For example, each vertical member 925 may be made of an elastic material. Alternatively, each vertical member 925 may be spring loaded to create an upward bias that may provide support in response to a downward force (e.g., the weight of an electronic device). The movement of each vertical member 925 may be independent from the movement of each other vertical member 925. Each vertical member 925 may be of the same height, although each vertical member 925 may have a different width, shape, or diameter.

Each vertical member 925 may include a top portion of any suitable shape, such as a flat, circular, or hexagonal top portion. In some embodiments, the top face of each vertical member 925 may form a portion of support layer surface 920a. Support layer surface 920a may be of any suitable thickness to experience the maximum deformation in response to the application of a downward force resulting from an electronic device being connected to universal dock 900. In some embodiments, each vertical member 925 may be evenly spaced with respect to each other vertical member 925, and the top portion of each vertical member 925 may touch the top portion of at least one other vertical member 925 to form a seamless support layer surface 920a. In some embodiments, each vertical member 925 may include a hexagonal top portion that may contact six other vertical members 925 in a pattern that may resemble a honeycomb to form a seamless support layer surface 920a. In some embodiments, a seamless support layer surface 920a may be formed by interconnecting the top portion of each vertical member 925, including, for example, by means of a Teflon sheet or a webbing that may unite the top portions of each vertical member 925, or any other suitable material.

Figure 11:
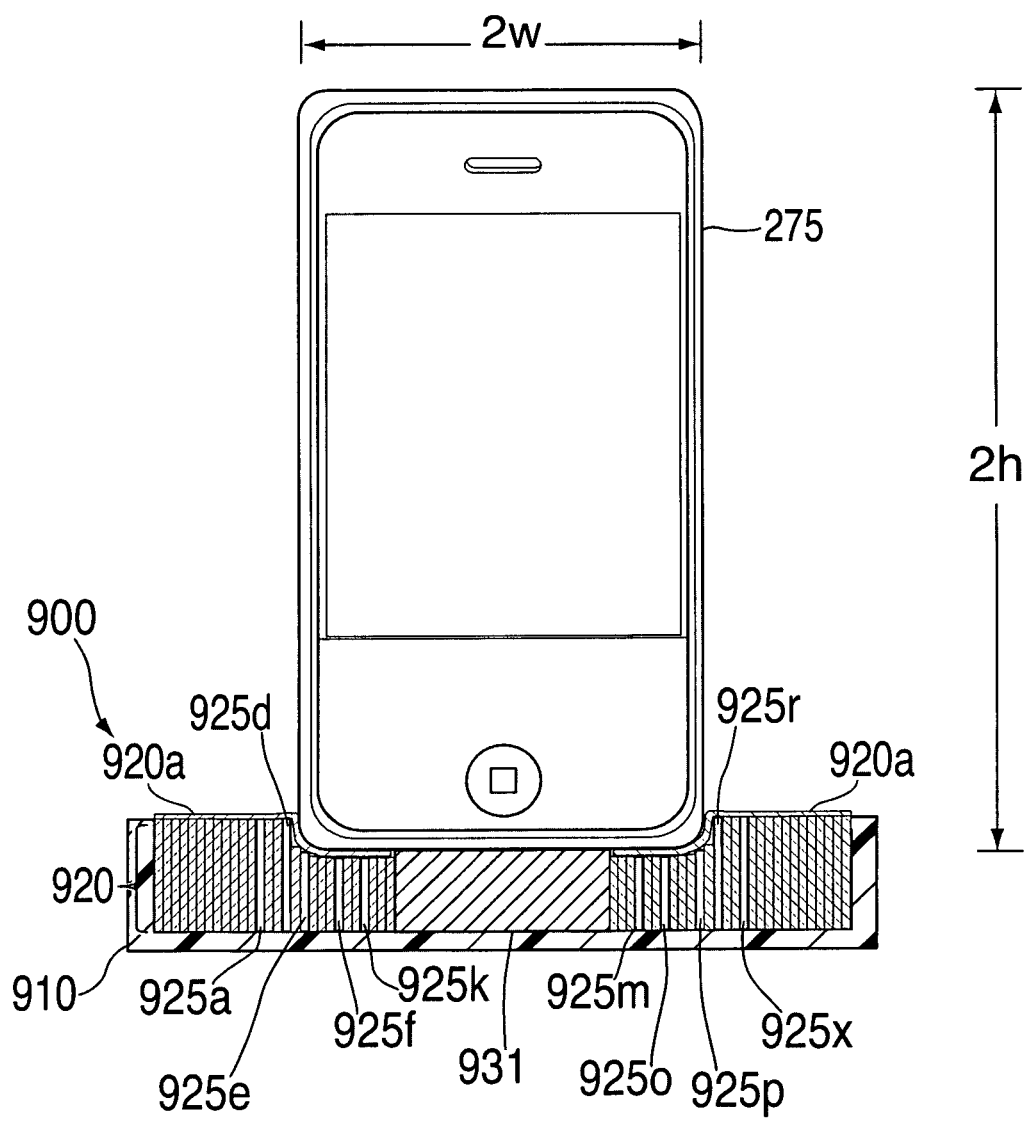
FIG. 11 shows a cross-sectional view of the portion of the universal dock of FIG. 10, but connected to the first electronic device of FIGS. 2A and 2B, in accordance with some embodiments of the invention.

FIG. 11 shows a cross-sectional view of the portion of universal dock 900 (FIG. 10), but connected to first electronic device 275 (FIGS. 2A and 2B) in accordance with some embodiments of the invention. Electronic device 275 may be connected to universal dock 900 using any suitable approach. For example, electronic device 275 may be connected when connector 250 (FIG. 2B) is coupled to connector 930 (FIG. 10). If electronic device 275 is connected to universal dock 900, electronic device 275 may contact support layer surface 920a and may compress support layer 920.

In establishing an electrical connection between connector 250 and connector 930, the weight of electronic device 275 may compress those vertical members 925 located underneath electronic device 275. For example, individual vertical members 925f, 925k, 925m, and 925o may be compressed in response to a downward force (e.g., the weight of electronic device 275) as electronic device 275 is connected to connector 930. Vertical members 925a, 925d, 925r, and 925x may not compress because the weight of electronic device 275 may not exert a downward force on that portion of support layer 920 that includes vertical members 925a, 925d, 925r, or 925x. Vertical members 925d and 925r may contact the sides of electronic device 275 and may provide lateral support to electronic device 275 to prevent electronic device 275 from tilting or shifting while connected to universal dock 900.

Other vertical members 925 may be at least partially compressed by the weight of electronic device 275 (i.e., more than vertical members 925d and 925r), but may be compressed less than vertical members 924f, 925k, 925m, and 925o because of the shape of the edges of electronic device 275. For example, as shown, electronic device 275 may include rounded edges that may contact only a part of a top portion of a vertical member 925 (see, e.g., vertical members 925e and 925p), and that vertical member 925 may be compressed in response to the contact, but may not be compressed as much as if electronic device 275 contacted all of the top portion of that vertical member 925, or if more of the weight of device 275 was displaced on that member.

In some embodiments, electronic device 275 may include different dimensions (e.g., electronic device 275 may be wider than what is shown in FIG. 11) and vertical members 925a, 925d, 925f, 925k, 925m, 925o, 925r, and 925x all may be at least partially compressed if a downward force is exerted on them. The compression of support layer 920 may support electronic device 275 by conforming to the unique dimensions of electronic device 275. The compression of support layer 920 and the deformation of support layer surface 920a may also give a user an aesthetic impression that universal dock 900 has been custom designed to support the shape of electronic device 275.

Figure 12:
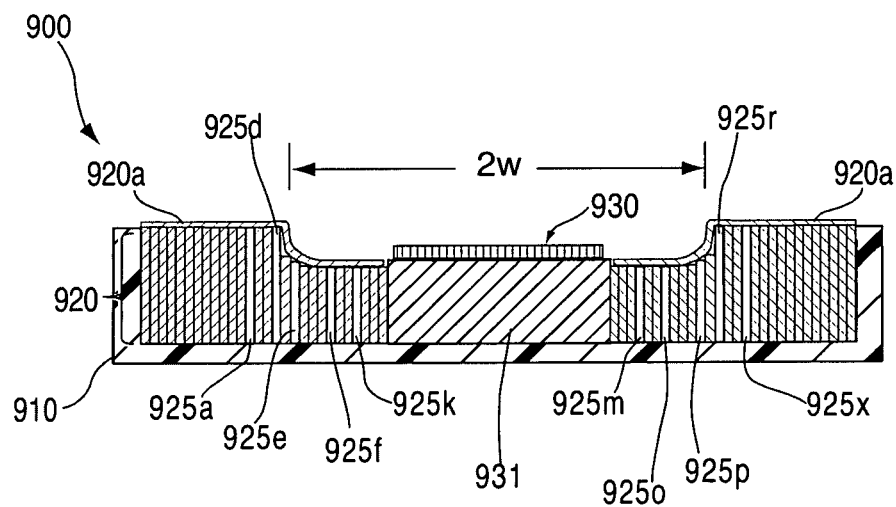
FIG. 12 shows a cross-sectional view of the portion of the universal dock of FIG. 11, but without the first electronic device, in accordance with some embodiments of the invention.

FIG. 12 shows the cross-sectional view of the portion of universal dock 900 of FIG. 11, but without first electronic device 275, in accordance with some embodiments of the invention. Electronic device 275 may have once been connected to connector 930 and thereafter removed from universal dock 900 using any suitable method. For example, a user may have pulled upwards on electronic device 275 to physically disconnect connector 250 from connector 930. Alternatively, a "RESET" button (not shown), which may be the same as, and may include some or all of the features of, "RESET" button 140 (FIG. 1), may have been depressed to eject electronic device 275 from universal dock 900. In some embodiments, if electronic device 275 is removed from universal dock 900, then those vertical members 925 that may have been at least partially compressed, including, for example, vertical members 925e, 925f, 925k, 925m, 925o, and 925p, may return naturally to their original, uncompressed state (see, e.g., FIG. 10).

In some embodiments, if electronic device 275 is removed, support layer 920 may retain its compressed profile and support layer 920a may retain its deformation in a shape that may correspond with the dimensions of electronic device 275. This lasting compression may be desirable because a user may connect electronic device 275 to universal dock 900 again without having to compress support layer 920 to conform to the dimensions of electronic device 275. Despite the compression of support layer 920 and the deformation of support layer surface 920a, base 931 and housing 910 may not compress so as to allow electronic device 275 to connect with connector 930 at a fixed point. The compression of support layer 920 and the deformation of support layer surface 920a may be relieved in some embodiments by depressing a "RESET" button.

Figure 13:
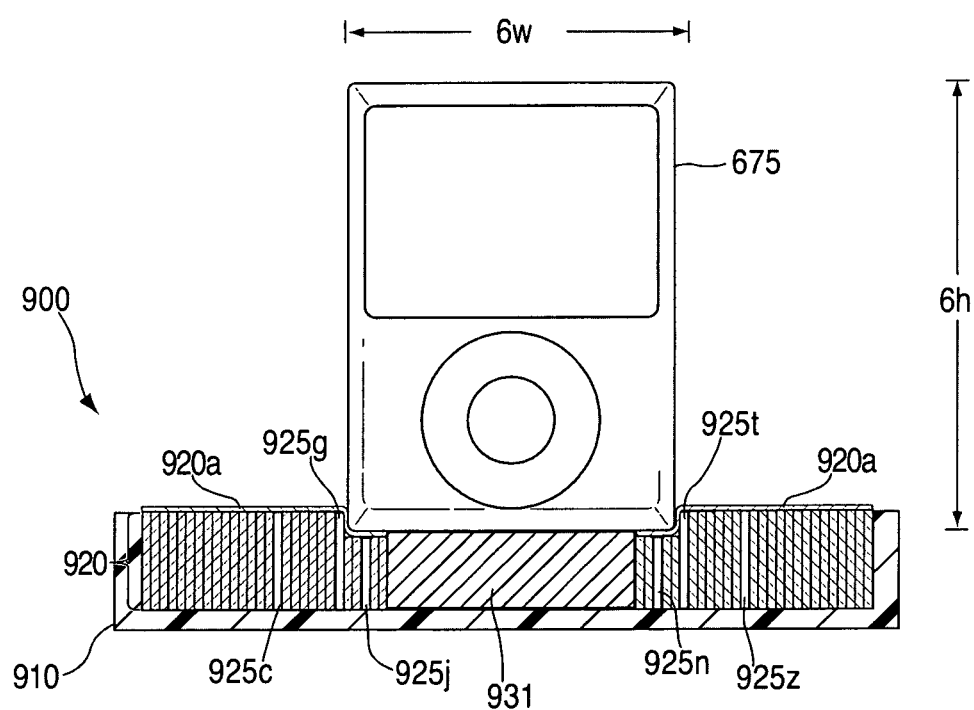
FIG. 13 shows a cross-sectional view of the portion of the universal dock of FIG. 10, but connected to the second electronic device of FIGS. 6A and 6B, in accordance with some embodiments of the invention.

FIG. 13 shows a cross-sectional view of the portion of universal dock 900 of FIG. 10, but connect to second electronic device 675 (FIGS. 6A and 6B), in accordance with some embodiments of the invention. Electronic device 675 may be connected to universal dock 900 using any suitable approach. For example, electronic device 675 may be connected when connector 650 (FIG. 6B) is coupled to connector 930 (FIG. 10). If electronic device 675 is connected to universal dock 900, electronic device 675 may contact support layer surface 920a and may compress support layer 920.

In establishing an electrical connection between connector 650 and connector 930, the weight of electronic device 675 may compress those vertical members 925 located underneath electronic device 675. For example, individual vertical members 925j and 925n may be compressed in response to a downward force (e.g., the weight of electronic device 675) as electronic device 675 is connected to connector 930. Vertical members 925c, 925g, 925t, and 925z may not compress because the weight of electronic device 675 may not exert a downward force on that portion of support layer 920 that includes vertical members 925c, 925g, 925t, or 925z. Vertical members 925g and 925t may contact the sides of electronic device 675 and may provide lateral support to electronic device 675 to prevent electronic device 675 from tilting or shifting while connected to universal dock 900.

Vertical members 925 may be compressed by the weight of electronic device 675 in a different pattern than the compression of vertical members 925 by electronic device 275 because of the different shape of the edges of electronic device 675 and electronic device 275. While electronic device 275 may include rounded edges, electronic device 675 may include straight edges that may contact the top portions of certain vertical members 925 (e.g., vertical members 925j and 925n), which may be compressed in response to the contact. Other vertical members may not be partially compressed because the straight edges of electronic device 675 may prevent electronic device 675 from contacting only a part of the top portion of certain other vertical members 925 or from displacing a different amount of weight or downward force on certain vertical members 925 as compared to other vertical members 925.

In some embodiments, electronic device 675 may include different dimensions (e.g., electronic device 675 may be wider than what is shown in FIG. 13) and vertical members 925c, 925e, 925j, 925n, 925t, and 925z all may be compressed if a downward force is exerted on them. The compression of support layer 920 may support electronic device 675 by conforming to the unique dimensions of electronic device 675. The compression of support layer 920 and the deformation of support layer surface 920a may also give a user an aesthetic impression that universal dock 900 has been custom designed to support the shape of electronic device 675.

Figure 14:
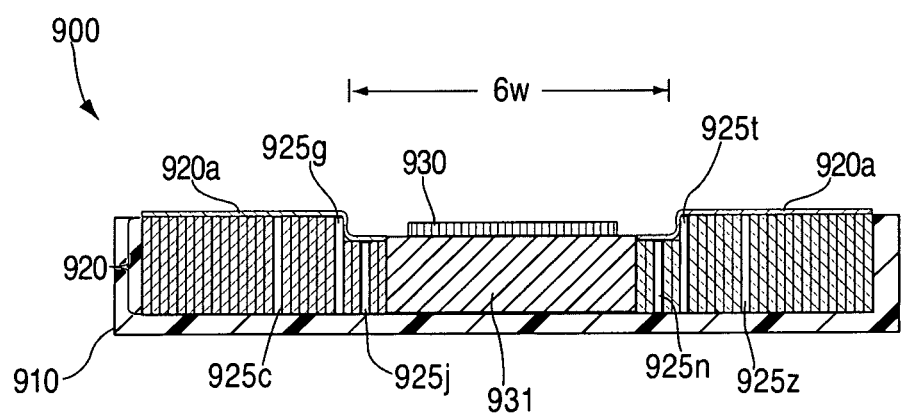
FIG. 14 shows a cross-sectional view of the portion of the universal dock of FIG. 13, but without the second electronic device, in accordance with some embodiments of the invention.

FIG. 14 shows the cross-sectional view of the portion of universal dock 900 of FIG. 13, but without second electronic device 675, in accordance with some embodiments of the invention. Electronic device 675 may have once been connected to connector 930 and thereafter removed from universal dock 900 using any suitable method. For example, a user may have pulled upwards on electronic device 675 to physically disconnect connector 650 from connector 930. Alternatively, a "RESET" button (not shown), which may be the same as, and may include some or all of the features of, "RESET" button 140 (FIG. 1), may have been depressed to eject electronic device 675 from universal dock 900. In some embodiments, if electronic device 675 is removed from universal dock 900, then those vertical members 925 that may have been compressed, including, for example, vertical members 925j and 925n, may return naturally to their original, uncompressed state (see, e.g., FIG. 10).

In some embodiments, if electronic device 675 is removed, support layer 920 may retain its compressed profile and support layer 920a may retain its deformation in a shape that may correspond with the dimensions of electronic device 675. Because of the differences in their dimensions, the compressed profile of support layer 920 following the removal of second electronic device 675 may appear different to a user of universal dock 900 than the compressed profile of support layer 920 following the removal of first electronic device 275. This lasting compression may be desirable because a user may connect electronic device 675 to universal dock 900 again without having to compress support layer 920 to conform to the dimensions of electronic device 675. Despite the compression of support layer 920 and the deformation of support layer surface 920a, base 931 and housing 910 may not compress so as to allow electronic device 675 to connect with connector 930 at a fixed point. The compression of support layer 920 and the deformation of support layer surface 920a may be relieved in some embodiments by depressing a "RESET" button.

Figure 15:
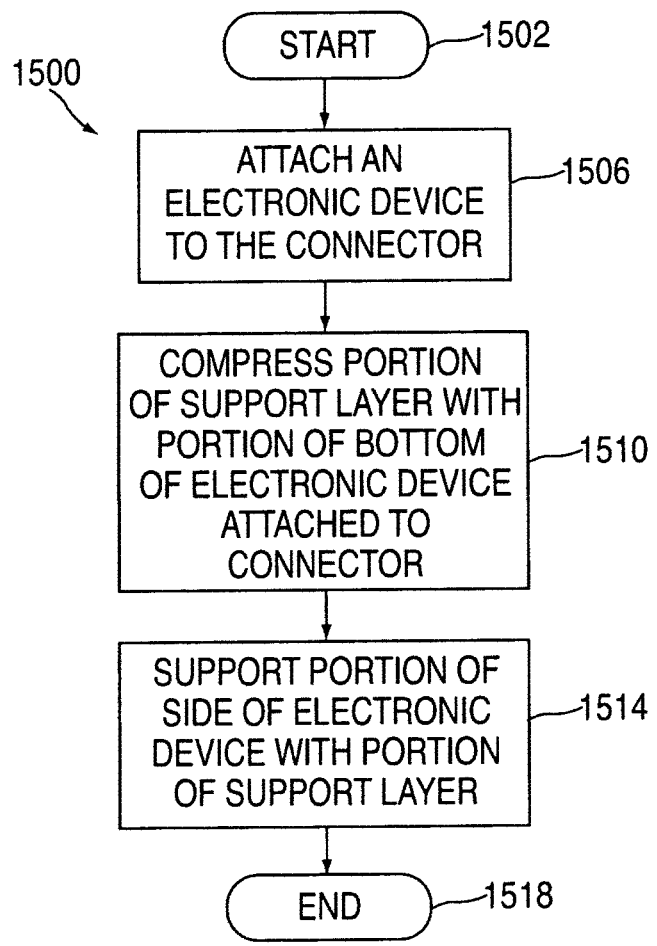
FIG. 15 is a flowchart of an illustrative process for supporting an electronic device that may be attached to a universal dock, in accordance with some embodiments of the invention.

FIG. 15 is a flowchart of an illustrative process for supporting an electronic device that may be attached to a universal dock in accordance with some embodiments of the invention. Process 1500 may begin at step 1502. At step 1506, an electronic device may be attached to a connector within a universal dock. For example, first electronic device 275 of FIGS. 2A and 2B, or second electronic device 675 of FIGS. 6A and 6B, may be attached to connector 130 of universal dock 100 (FIG. 1) or connector 930 of universal dock 900 (FIG. 10). At step 1510, a first portion of the support layer within the universal dock, such as support layer 120 or support layer 920, may compress in response to the downward force (e.g., the weight) being applied to the support layer when the electronic device is attached to the connector. At step 1514, a portion of the sides of the electronic device also may be laterally supported by a second portion of the support layer when the electronic device is attached to the connector. Process 1500 may then advance to step 1518 and end.

Figure 16:
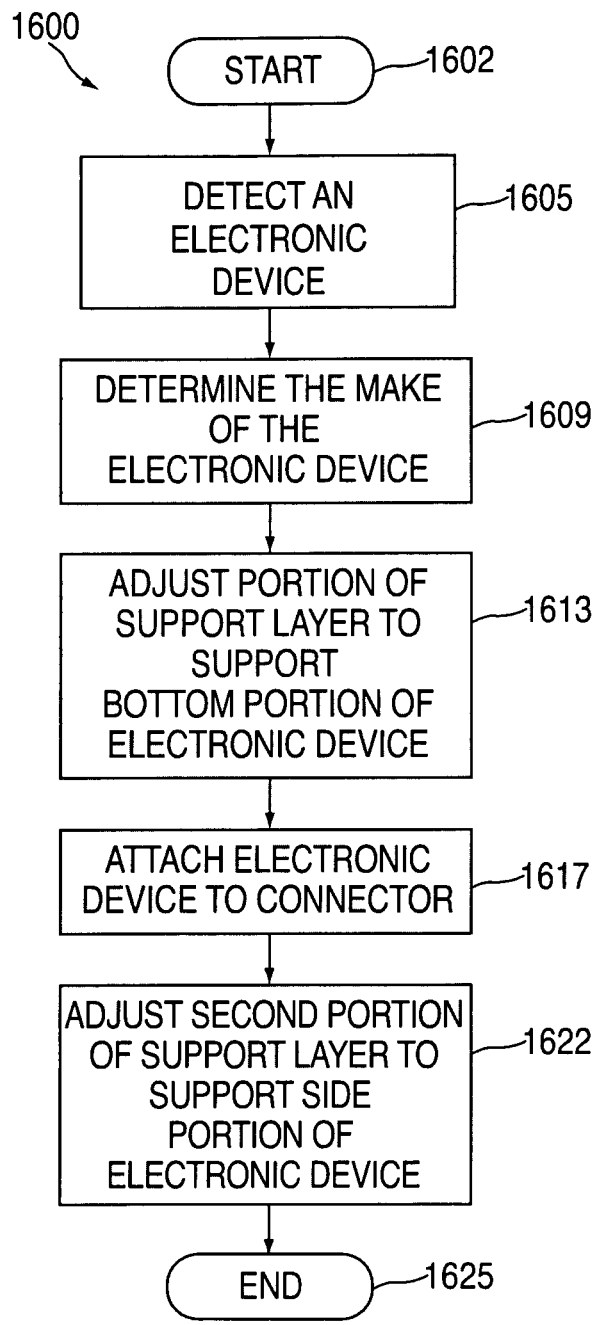
FIG. 16 is a flowchart of an illustrative process for detecting an electronic device being attached to a universal dock and customizing the shape of a support layer within the universal dock to support the detected electronic device, in accordance with some embodiments of the invention.

FIG. 16 is a flowchart of an illustrative process for detecting an electronic device being attached to a universal dock and customizing the shape of a support layer within the universal dock to support the detected electronic device, in accordance with some embodiments of the invention. Process 1600 may begin at step 1602. At step 1605, a universal dock may detect that an electronic device is being attached or is about to be attached to a connector within the universal dock.

For example, universal dock 100 (FIG. 1) or universal dock 900 (FIG. 10) may detect (e.g., using logic circuitry within the universal dock) that an electronic device, such as electronic device 275 of FIGS. 2A and 2B or electronic device 675 of FIGS. 6A and 6B, may be initiating contact or is about to initiate contact with the connector (e.g., connector 130 of FIG. 1 or connector 930 of FIG. 10) of the universal dock. In some embodiments of the invention, the universal dock may contain circuitry capable of alerting the universal dock that a particular electronic device is about to be connected. For example, a face of the universal dock may include one or more buttons, each of which may be associated with a particular electronic device type. If the circuitry detects that one of the buttons is depressed, then the circuitry may signal the support layer to conform to the shape of the electronic device associated with the depressed button. As another example, the circuitry may include a sensor (e.g., sensor 150 of FIG. 1) that may communicate wirelessly with an electronic device. The electronic device may signal its presence to the sensor, or the sensor may detect the proximity of the electronic device. Upon receiving a signal from the electronic device or detecting the proximity of the electronic device, the sensor may signal the circuitry within the universal dock that the particular electronic device is about to be connected.

At step 1609, the universal dock may determine the make of the detected electronic device. For example, the universal dock may include a memory that may be able to detect any suitable number of electronic devices that may be compatible with the universal dock and its connector.

At step 1613, a first portion of the support layer within the universal dock, such as support layer 120, support layer 920 or any other suitable support layer, may adjust its shape in response to the universal dock determining that a particular electronic device is being attached to the connector. For example, the support layer may compress downwards to support the dimensions of electronic device 275, as shown in FIGS. 4A-5B, in anticipation of electronic device 275 attaching to the connector. Alternatively, the support layer may swell upwards from the base of the universal dock to surround and support the dimensions of electronic device 675 in anticipation of electronic device 675 attaching to the connector. At step 1617, the electronic device may be attached to the connector within the universal dock. At step 1622, a portion of the sides of the electronic device also may be laterally supported by a second portion of the support layer when the electronic device is attached to the connector. Process 1600 may then advance to step 1625 and end.

While there have been described apparatus and methods with improved aesthetics for supporting a variety of electronic devices, it is to be understood that many changes may be made therein without departing from the spirit and scope of the invention. It will also be understood that various directional and orientational terms such as "up" and "down," "left" and "right," "top" and "bottom," "side" and "edge" and "corner," "height" and "width" and "depth," "horizontal" and "vertical," and the like are used herein only for convenience, and that no fixed or absolute directional or orientational limitations are intended by the use of these words. For example, the positioning of electronic devices on support layers and universal docks of this invention can have any desired orientation. If reoriented, different directional or orientational terms may need to be used in their description, but that will not alter their fundamental nature as within the scope of the invention. Those skilled in the art will appreciate that the invention can be practiced by other than the described embodiments, which are presented for purposes of illustration rather than of limitation, and the invention is limited only by the claims which follow.

What is claimed is:

1. A dock for supporting a plurality of differently-shaped electronic devices, the dock comprising:
   a housing;
   a connector coupled to a top face of the housing;
   a compressible support layer positioned on the top face of the housing and at least partially about the connector, wherein at least a portion of the compressible support layer compresses to the shape of at least a portion of an electronic device that is attached to the connector; and circuitry coupled to the connector to detect the electronic device attached to the connector and to operate the electronic device.

2. The dock of claim 1, further comprising a sensor coupled to the circuitry.

3. The dock of claim 2, wherein the sensor receives from an external device an instruction to control the electronic device, and wherein the circuitry operates the electronic device in response to the sensor receiving the instruction.

4. The dock of claim 1, further comprising a button coupled to the housing, wherein depression of the button ends the attachment between the connector and the electronic device.

5. The dock of claim 4, wherein the depression of the button ejects the electronic device from the dock.

6. The dock of claim 4, wherein the depression of the button relieves the compression of the compressible support layer.

7. The dock of claim 1, wherein the compressible support layer comprises at least one of an elastic material and an array of vertical members.

8. The dock of claim 1, further comprising a base coupled between the housing and the connector.

9. The dock of claim 1, wherein at least a non-compressed portion of the compressible support layer provides lateral support to the electronic device that is attached to the connector.

10. The dock of claim 1, wherein the compressible support layer comprises an array of compressible vertical members.

11. The dock of claim 10, wherein each of the vertical members includes a top portion, and wherein at least some of the top portions are interconnected using at least one of a webbing and a Teflon sheet.

12. The dock of claim 1, wherein at least a first portion of the compressible support layer compresses more than at least a second portion of the compressible support layer, and wherein at least the first portion of the compressible support layer compresses less than at least a third portion of the compressible support layer.

13. The dock of claim 1, wherein:
the connector is coupled to a first portion of the top face of the housing;
the compressible support layer is coupled to a second portion of the top face of the housing; and
the first and second portions are co-planar.

14. A dock for supporting a plurality of differently-shaped electronic devices, the dock comprising:
a housing;
a connector coupled to the housing; and
a compressible support layer positioned at least partially about the connector and having an independently compressible sub-portion, wherein:
the connector passes through the compressible support layer to allow the connector to emerge on a top face of the dock;
the compressible support layer is configured to appear customized to the shape of any electronic device of the differently-shaped electronic devices attached to the connector;
the compressible support layer supports the electronic device; and
the compressible support layer comprises at least one of an elastic material and an array of vertical members.

15. The dock of claim 14, wherein at least a portion of the compressible support layer provides lateral support to the electronic device that is attached to the connector.

16. The dock of claim 14, wherein the electronic device compresses at least a portion of the compressible support layer between the electronic device and the top face of the dock.

17. A dock comprising:
a housing;
a connector coupled to the housing; and
a compressible support layer coupled to the housing, wherein:
the compressible support layer deforms in a same direction as a force exerted by an electronic device when the electronic device is being connected to the connector;
the compressible support layer deforms to at least one dimension of the electronic device when the electronic device is being connected to the connecter; and
wherein the compressible support layer comprises an array of compressible vertical members.

18. The dock of claim 17, wherein each of the vertical members comprises a top portion,
and wherein at least some of the top portions are interconnected using at least one of a webbing and a Teflon sheet.

19. The dock of claim 17, wherein each of the vertical members comprises a top portion, and wherein the top portions of the vertical members are interconnected to form a seamless web.

20. The dock of claim 17, wherein the connector is coupled to a top face of the housing, and wherein the electronic device compresses at least a portion of the compressible support layer between the electronic device and the top face of the housing.

21. The dock of claim 17, wherein a first portion of the compressible support layer compresses more than a second portion of the compressible support layer when the electronic device is attached to the connector, and wherein the first portion of the compressible support layer compresses less than a third portion of the compressible support layer when the electronic device is attached to the connector.

22. The dock of claim 21, wherein the second portion of the compressible support layer experiences no compression when the electronic device is attached to the connector.

23. The dock of claim 22, wherein the first portion of the compressible support layer comprises a first group of the vertical members, wherein the second portion of the compressible support layer comprises a second group of the vertical members, and wherein the third portion of the compressible support layer comprises a third group of the vertical members.

24. The dock of claim 23, wherein the connector is coupled to a top face of the housing, and wherein the array of vertical members is coupled to the top face.

25. A dock for supporting a plurality of differently-shaped electronic devices, the dock comprising:
a housing;
a connector coupled to a top face of the housing; and
a compressible support layer including at least one of an elastic material and an array of vertical members, and positioned on the top face of the housing and at least partially about the connector, wherein at least a portion of the compressible support layer compresses to the shape of at least a portion of an electronic device that is attached to the connector.

* * * * *